(12) United States Patent
Horiuchi et al.

(10) Patent No.: US 6,465,886 B1
(45) Date of Patent: Oct. 15, 2002

(54) SEMICONDUCTOR DEVICE HAVING CIRCUIT PATTERN AND LANDS THEREON

(75) Inventors: Michio Horiuchi; Shigetsugu Muramatsu, both of Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 0 days.

(21) Appl. No.: 09/615,558

(22) Filed: Jul. 13, 2000

(30) Foreign Application Priority Data

Jul. 13, 1999  (JP) ............................... 11-198668

(51) Int. Cl.[7] ............... H01L 2/48; H01L 23/52; H01L 29/40
(52) U.S. Cl. .............. 257/738; 257/779; 257/784; 257/786
(58) Field of Search ................ 438/612, 613, 438/614; 257/734, 738, 779, 780, 781, 786, 784

(56) References Cited

U.S. PATENT DOCUMENTS 5,834,844 A  * 11/1998 Akagawa et al. ........... 257/734
5,989,991 A  * 11/1999 Lien .......................... 438/612

FOREIGN PATENT DOCUMENTS

| EP | 0 469 216 A1 | 2/1992 |
|---|---|---|
| JP | 59-181041 | 10/1984 |
| JP | 10-284634 | 10/1998 |

* cited by examiner

Primary Examiner—Olik Chaudhuri
Assistant Examiner—Hoai Pham
(74) Attorney, Agent, or Firm—Pennie & Edmonds LLP

(57) ABSTRACT

Interconnection wiring lines connecting electrode terminals with external connection terminals are easily provided for semiconductor chips having increased number or density of external connection terminals as in/out terminals. A semiconductor device including a semiconductor chip having electrode terminals electrically connected to external connection terminals, the device comprising: a semiconductor chip having an electrode terminal carrying surface including electrode terminals and interconnection wiring lines, each of the interconnection wiring lines having one end bonded to one of the electrode terminals and the other end forming a pad; an insulating layer formed on the electrode terminal carrying surface to cover the electrode terminals, the interconnection wiring lines and the remaining area of the electrode terminal carrying surface; conductor lands formed on the insulating layer, each of the conductor lands having a part forming a via extending through the insulating layer to the pad of one of the interconnection wiring lines; and external connection terminals formed on the lands.

3 Claims, 6 Drawing Sheets

SEMICONDUCTOR DEVICE HAVING CIRCUIT PATTERN AND LANDS THEREON

BACKGROUND OF THE INVENTION

1. Field of the Invention

The present invention relates to a chip size package, i.e., a semiconductor device having substantially the same size as that of a semiconductor chip included therein.

2. Description of the Related Art

A chip size package (CSP) is a semiconductor device having substantially the same size as that of a semiconductor chip included therein and having an electrode terminal carrying surface including electrode terminals, electrically connected to external connection terminals, in the form of solder balls, etc. FIG. 7 shows a cross-sectional view of a CSP including a semiconductor chip 10 and external connection terminals 12, which are arranged entirely over an electrode carrying surface 11 of the semiconductor chip 10 that has a very small area. A protective film 14 protects the electrode carrying surface 11.

FIG. 8 is a plan view showing an arrayed arrangement of external connection terminals 12 over the electrode carrying surface 11 of the semiconductor chip 10. The arrangement of the electrode terminals 16 on the electrode terminal carrying surface 11 varies with the types of CSP 10. The shown type of semiconductor chip includes the electrode terminals 16 arranged along the periphery of the electrode terminal carrying surface 11 and interconnection wiring lines 18 outwardly extending from the arrayed external connection terminals 12 to the electrode terminals 16 to provide electrical connection between the electrode terminals 16 and the external connection terminals 12.

FIG. 9 is an enlarged partial cross-sectional view showing that the interconnection wiring lines 18 have a part forming a land 18a with a sufficient size for bonding to the external connection terminals 12, i.e., the interconnection wiring lines 18 have one end bonded to the electrode terminals 16 and the other end forming the land 18a positioned for bonding to the external connection terminals 12.

An insulating layer 20 covers the surface of the semiconductor chip 10 and has openings at positions corresponding to the electrode terminals 16. After the insulating layer 20 having the openings is formed on the electrode terminal carrying surface 11 of the semiconductor chip 10, a conductor layer is formed on the insulating layer 20, by sputtering, etc., and is then patterned by etching to form the interconnection wiring lines 18 each having one end forming a land 18a.

A chip size package has a problem that, as the number or density of the external connection terminals 12 is increased, the space between neighboring external connection terminals 12 becomes too small to allow the interconnection wiring lines 18 to run therethrough. There may be a case in which a plurality of interconnection wiring lines 18 must run through the space between neighboring external connection terminals 12.

It is a continuing trend that CSPs will have a further increased number of in/out terminals or external connection terminals to provide multipin CSPs, and in an extreme case, it may not be possible to run interconnection wiring lines 18 through the space between neighboring external connection terminals 12.

SUMMARY OF THE INVENTION

The object of the present invention is to provide a CSP or a semiconductor device having substantially the same size as that of a semiconductor chip included therein, particularly a multipin CSP structure which enables interconnection wiring lines connecting electrode terminals with external connection terminals to be easily provided for semiconductor chips having increased number or density of external connection terminals as in/out terminals.

To achieve the object according to the present invention, there is provided a semiconductor device including a semiconductor chip having electrode terminals electrically connected to external connection terminals, the device comprising:

a semiconductor chip having an electrode terminal carrying surface including electrode terminals and interconnection wiring lines, each of the interconnection wiring lines having one end bonded to one of the electrode terminals and the other end forming a pad;

an insulating layer formed on the electrode terminal carrying surface to cover the electrode terminals, the interconnection wiring lines and the remaining area of the electrode terminal carrying surface;

conductor lands formed on the insulating layer, each of the conductor lands having a part forming a via extending through the insulating layer to the pad of one of the interconnection wiring lines; and external connection terminals formed on the lands.

Typically, the pads are smaller in diameter than the lands. The via is preferably formed of a conductor layer coating a side wall and a bottom of a through hole penetrating the insulating layer, the bottom being defined by a surface of the interconnection wiring lines.

In a preferred embodiment, the lands occupy areas of the insulating layer that overlap areas of the electrode terminal carrying surface that are occupied by the interconnection wiring lines.

DESCRIPTION OF THE PREFERRED EMBODIMENTS

Figure 1:
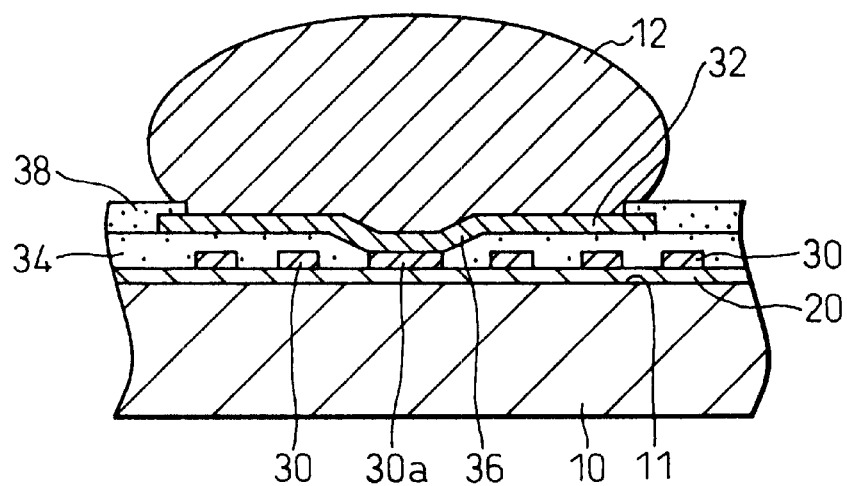
FIG. 1 is a cross-sectional view showing a semiconductor device structure including a semiconductor chip having an electrode terminal carrying surface on which electrode terminals and interconnection wiring lines are disposed, an insulating layer disposed on the electrode terminal carrying surface, and an external connection terminal disposed on the insulating layer, according to a preferred embodiment of the present invention.

FIG. 1 is a partial cross-sectional view showing a semiconductor device structure according to a preferred embodiment of the present invention. The shown device structure includes a semiconductor chip 10 having an electrode terminal carrying surface 11 having an electrode terminal (not shown) formed thereon and electrically connected to an external connection terminal or solder ball 12 through an interconnection wiring line 30 having one end (a first end, not shown) bonded to the electrode terminal and the other end (a second end) forming a pad 30a bonded to a via 36 defined by a part of a conductor land 32 bonded to the external connection terminal 12 formed thereon, in which the interconnection wiring line 30 and the land 32 are disposed on the electrode terminal carrying surface 11 and on an insulating layer 34, respectively, to prevent mutual interference therebetween while providing electrical connection therebetween through the via 30a.

More specifically, the interconnection wiring line 30 is formed on an insulating layer 20 coating the electrode terminal carrying surface 11 of the semiconductor chip 10 and has one end (the first end) bonded to an electrode terminal of the chip 10.

Figure 9:
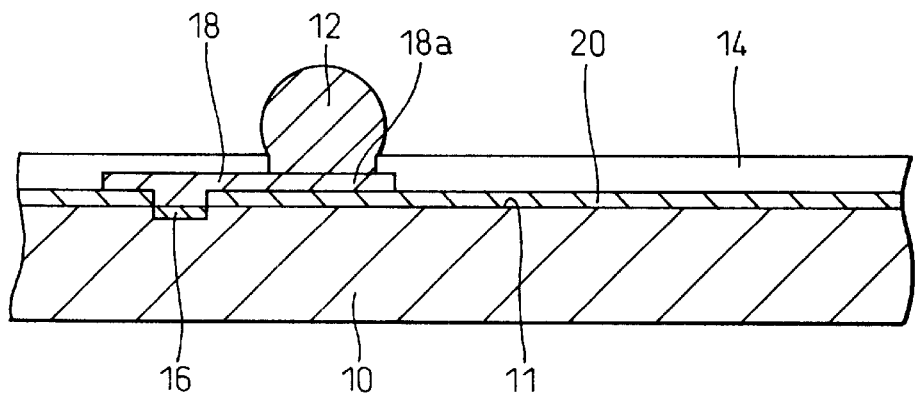
FIG. 9 is a cross-sectional view showing a conventional semiconductor device structure including a semiconductor chip having an electrode terminal carrying surface on which electrode terminals, external connection terminals and interconnection wiring lines are disposed.

To compare, the conventional semiconductor device, as shown in FIG. 9, has an interconnection wiring line 18 having one end (a first end) bonded to an electrode terminal 16 of a semiconductor chip 10 and the other end (a second end) forming a conductor land 18a bonded to an external connection terminal or solder ball 12.

According to the present invention, the interconnection wiring line 30 has the second end forming a pad 30a connected to the land 32 through the via 36 penetrating through the insulating layer 34 intervening between the interconnection wiring line 30 and the land 32. The pad 30a forms a part of the interconnection wiring line 30, electrically connects the interconnection wiring line 30 to the land 32 through the via 36 and has a diameter equivalent to the width of the interconnection wiring line 30 and smaller than the diameter of the land 32. The via 36 is formed by first forming a via hole penetrating through the insulating layer 34 so that the pad 30a is exposed to define the bottom of the via hole and then coating the inner surface of the via hole with a conductor layer.

The land 32 has a diameter far greater than the width of the interconnection wiring line 30. The positional relationship between the land 32, or the external connection terminal or solder ball 12, and the interconnection wiring line 30 is shown by FIG. 1 in a cross-sectional view or by FIG. 2 in a plan view.

According to the present invention, the interconnection wiring line 30 and the land 32 form separate layers with the insulating layer 34 intervening therebetween, so that the interconnection wiring line 30 and the land 32 can occupy areas overlapping on a plan view, i.e., the former runs under the latter without mutual interference except for the intended connection between the pad 30a and the via 36.

As previously described herein, the conventional semiconductor device has a structure in which interconnection wiring lines and external connection terminals are disposed in the same layer, i.e., on an electrode terminal carrying surface of a semiconductor chip, and the number or density of the external connection terminals is limited because spaces between the external connection terminals must be sufficient for the interconnection wiring lines(s) running therethrough in order to prevent interference between the interconnection wiring lines and the external connection terminals.

In the present invention, external connection terminals are disposed on lands formed on a surface of an insulating layer separate from an electrode terminal carrying surface on which interconnection wiring lines are formed, so that the interconnection wiring lines can run through the areas of the electrode terminal carrying surface that were conventionally occupied by the external connection terminals and so that the areas for the interconnection wiring lines and the external connection terminals are substantially increased to provide a semiconductor device with an increased number or density of the external connection terminals.

In the shown embodiment, the interconnection wiring line 30 is designed to be connected at one end to an electrode terminal of the semiconductor chip 10 and to be connected at the other end forming the pad 30a to the land 32.

The pad 30a is formed at a position for bonding to the land 32 through the via 36 formed by a part of the land 32. Although the land 32 shown in FIG. 2 has the via 36 at its center, the position of the via 36 is not necessarily so limited but may be formed by any part of the land 32. The pad 30a is designed to be positioned within an area in a top plan view that is occupied by the land 32 and the land 32 is designed to have a part forming the via 36 that corresponds to the position of the pad 30a. This provides an improved freedom of designing the arrangement of the interconnection wiring lines, including the pads, with respect to the positions of the lands or the external connection terminals.

Figure 3:
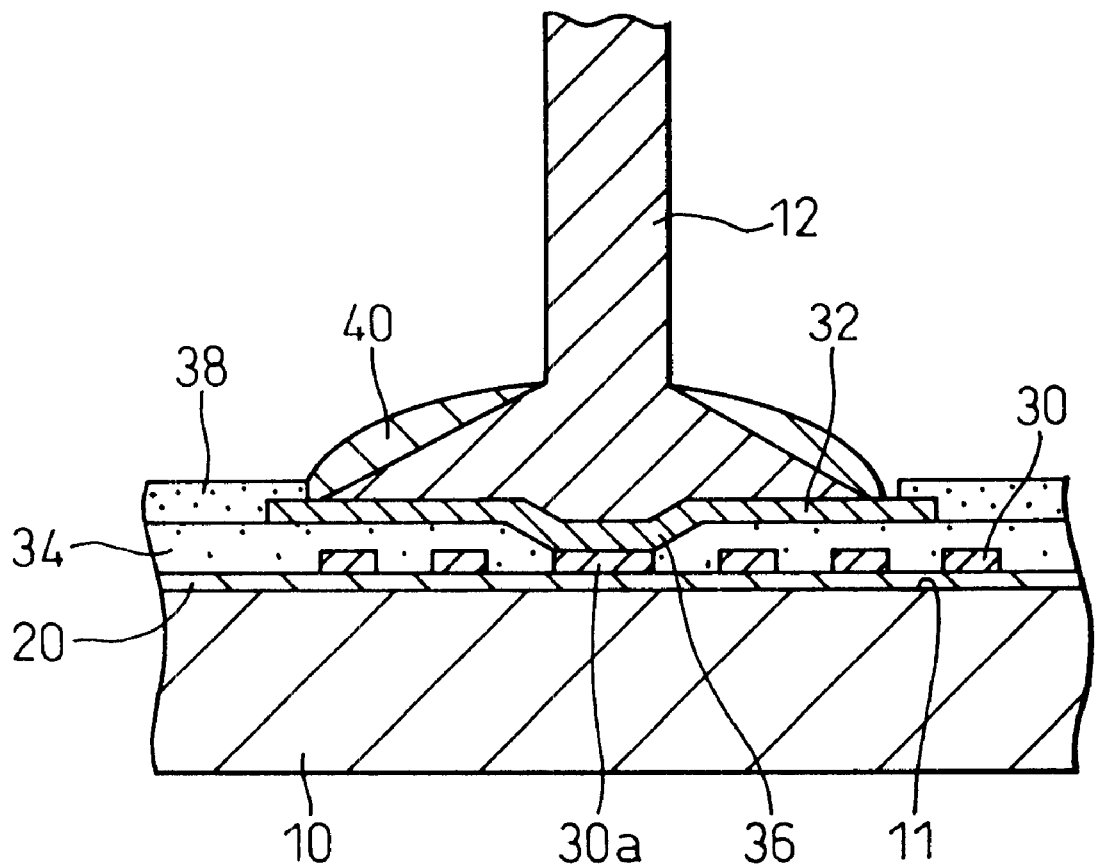
FIG. 3 is a cross-sectional view showing a semiconductor device structure according to another preferred embodiment of the present invention.

FIG. 3 shows a semiconductor device according to another preferred embodiment of the present invention, in which the external connection terminal 12 is in the form of a lead pin in replacement for a solder ball. A land 32 is formed on an insulating layer 34 which covers an interconnection wiring line 30, a via 36 electrically connects the interconnection wiring line 30 with the land 32 and an external connection terminal or lead pin 12 standing on and bonded to, the land 32. A solder 40 bonds the lead pin 12 to the land 32. The interconnection wiring line 30 is arranged to cause no interference with the external connection terminal or lead pin 12. A protective film 38 protects the surface of the insulating layer 34 on which surface the land 32 is formed.

Figure 2:
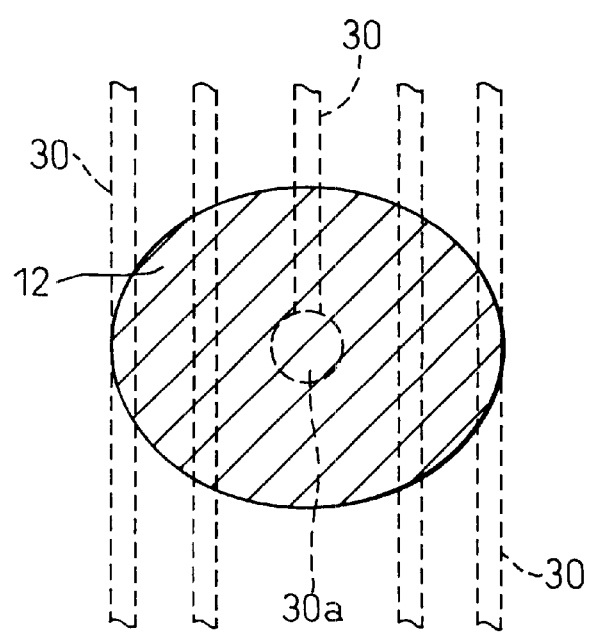
FIG. 2 is a plan view showing the mutual positioning of the external connection terminals and the interconnection wiring lines of the semiconductor device shown in FIG. 1.
Figure 4:
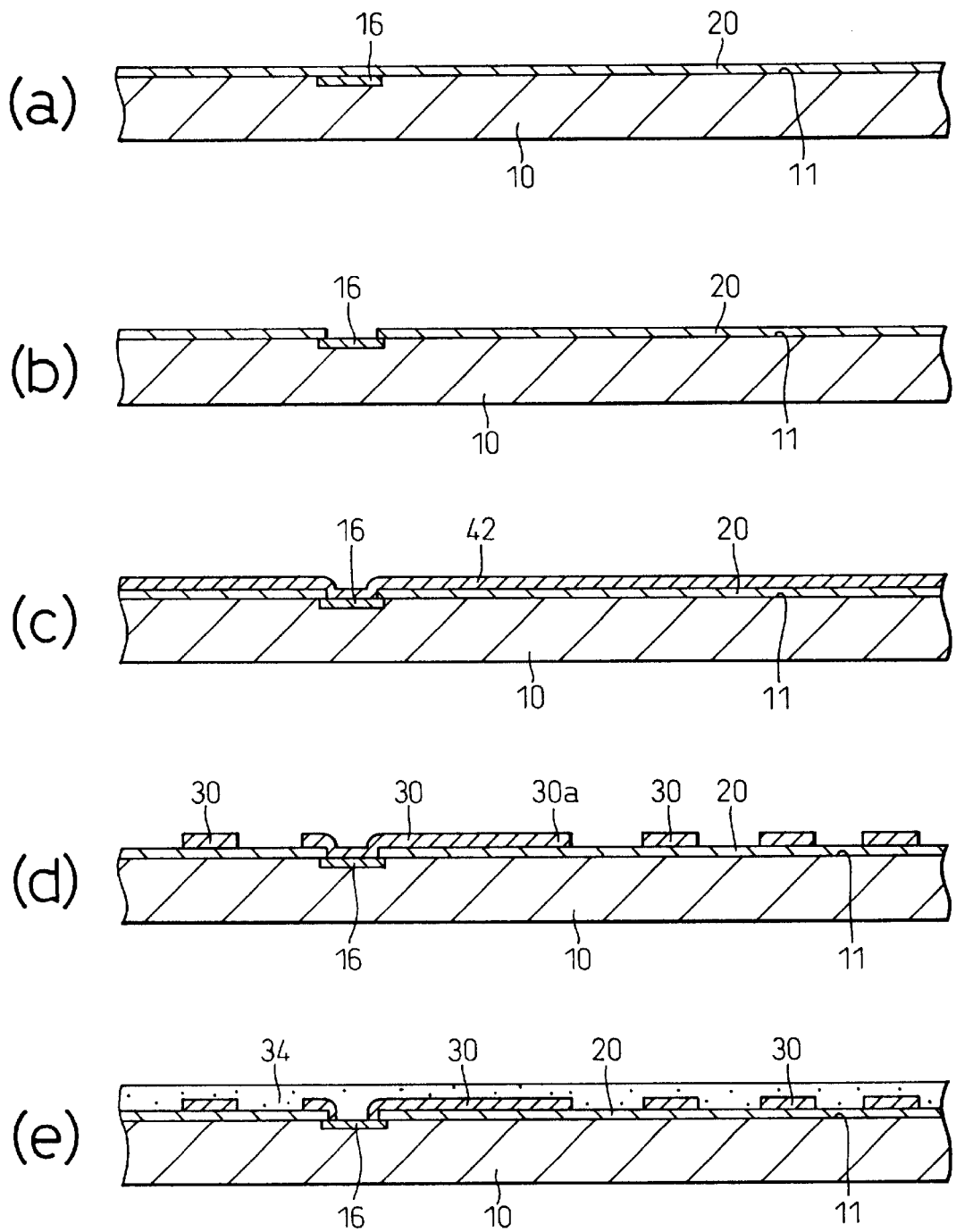
FIG. 4 includes cross-sectional views showing process steps for producing a semiconductor device according to a preferred embodiment of the present invention.
Figure 5:
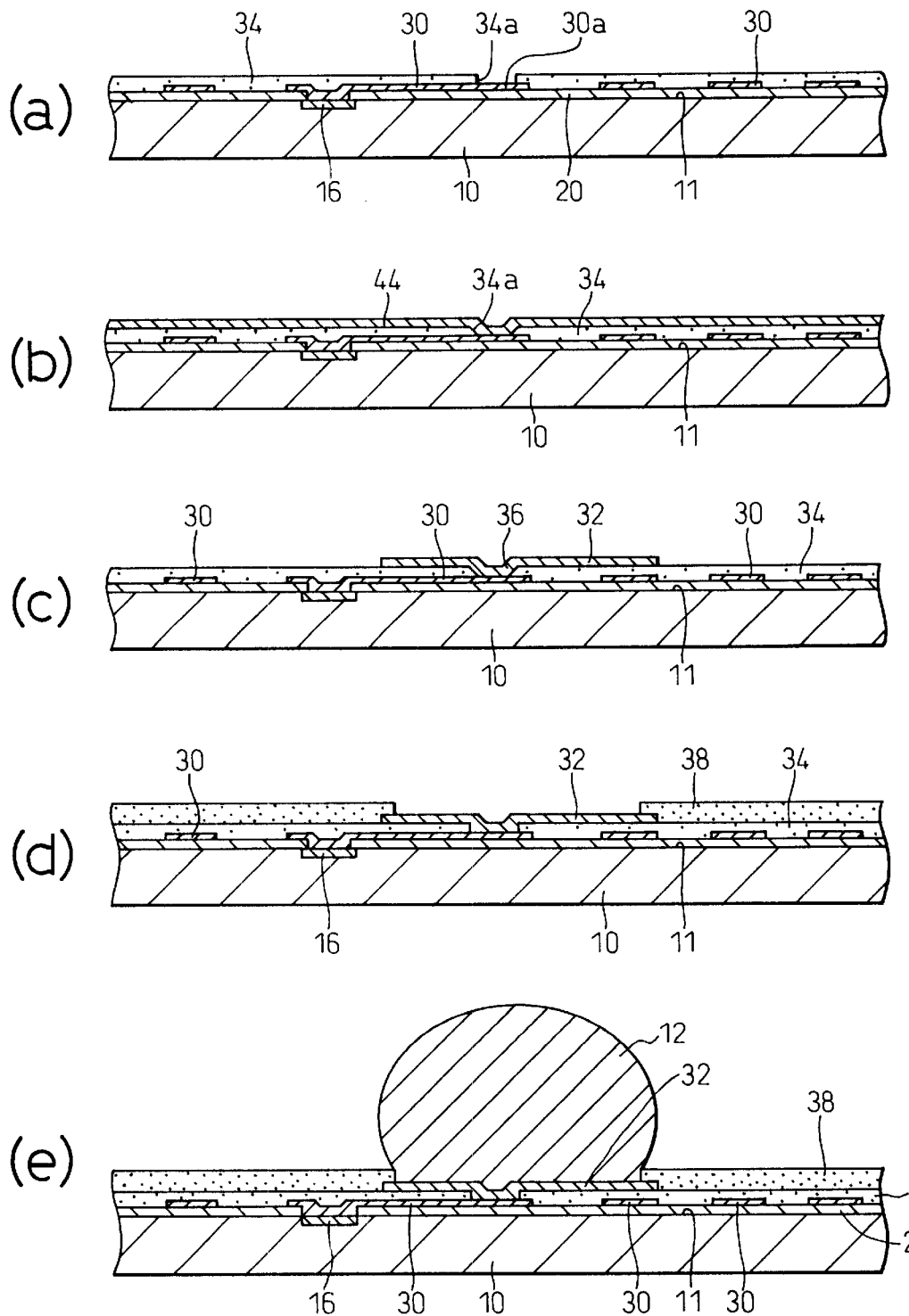
FIG. 5 includes cross-sectional views showing process steps subsequent to the steps shown in FIG. 4.

The semiconductor device shown in FIGS. 1 and 2 can be produced through the process steps shown in FIGS. 4 and 5.

FIG. 4 shows the process steps for forming interconnection wiring lines on an electrode terminal carrying surface of a semiconductor chip.

Referring to FIG. 4(a), an insulating layer 20 is formed on an electrode terminal carrying surface 11 of a semiconductor chip 10, by either applying a polyimide or other insulating resin or bonding an insulating resin film to the electrode terminal carrying surface 11.

Referring to FIG. 4(b), the insulating layer 20 is chemically etched or laser-irradiated to form an opening through which an electrode terminal 16 of the semiconductor chip 10 is exposed.

Referring to FIG. 4(c), a conductor layer 42 is formed to cover the insulating layer 20 and the opening including the side wall thereof and the exposed surface of the electrode terminal 16, by sputtering, plating, or other suitable coating method. The conductor layer 42 having a desired thickness is preferably formed by forming a thin conductor layer by sputtering or by electroless copper plating, followed by electrolytic copper plating using the thin conductor layer as a current supply layer.

Referring to FIG. 4(d), the conductor layer 42 is patterned by chemical etching to form interconnection wiring lines 30. Specifically, a photosensitive resist is applied to the surface of the conductor layer 42, the thus-formed resist layer is exposed to light and developed to form a resist pattern having a reversed pattern of the interconnection wiring 30, the conductor layer 42 is etched using the resist pattern as an etching mask, and the resist pattern is removed by dissolution to leave the patterned interconnection wiring 30 on the insulating layer 20. The each interconnection wiring line 30 has one end connected to the electrode terminal 16 of the semiconductor chip 10 and the other end forming the pad 30a.

Referring to FIG. 4(d), an insulating layer 34 is formed by applying a polyimide or other insulating resin or by bonding an insulating resin film to the surface on which the interconnection wiring line 30 is formed.

FIG. 5 shows the process steps for forming a land 32 on the insulating layer 34, the land 32 being electrically connected to the interconnection wiring line 30.

Referring to FIG. 5(a), the insulating layer 34 is either etched or laser-irradiated to form a via hole 34a penetrating through the insulating layer 34 to expose the upper surface of the pad 30a of the interconnection wiring line 30. The via hole 34a has a side wall defined by an exposed surface of the insulating layer 34 and a bottom defined by the exposed upper surface of the pad 30a. The via hole 34a is positioned on the pad 30a of the interconnection wiring line 30 and defines the site for forming a via providing electrical connection between the pad 30a and a land on the insulating layer 34.

Referring to FIG. 5(b), a conductor layer 44 is formed by sputtering or plating to cover the insulating layer 34 and the via hole 34a. The conductor layer 44 adheres to the side wall and bottom of the via hole 34a. The conductor layer 34 may be thickened, if necessary, by further electrolytic copper plating, etc.

Referring to FIG. 5(c), the conductor layer 44 is patterned by etching to form a land 32 on the insulating layer 34, i.e., by forming on the conductor layer 44 a resist pattern having a reversed pattern of the land 32 and etching the conductor layer 44 using the resist pattern as an etching mask, as mentioned above referring to FIG. 4(d). The thus-formed land 32 lies on the insulating layer 34 and has a part forming a via 36 filling the via hole 34a and electrically connecting the land 32 with the pad 30a of the underlying interconnection wiring line 30. The land 32 may be further plated with a protective film of gold, etc.

Referring to FIG. 5(d), a solder resist or other protective film 38 is formed on the surface on which the land 32 is formed, to cover the surface except for the area occupied by the land 32.

Referring to FIG. 5(d), a solder ball 12 as an external connection terminal is formed on, and bonded to, the land 32, typically by placing a solder ball on the land 32 and reflowing the solder ball, to complete a semiconductor device according to the present invention, in which the interconnection wiring line 30 and the land 32 are separated from each other by the intervening insulating layer 34 except for the via 36 connecting the interconnection wiring line 30 with the land 32 to consequently provide electrical connection between the electrode terminal 16 of the semiconductor chip 10 and the external connection terminal 12 through the interconnection wiring line 30.

The interconnection wiring line 30 and the land 32 may be formed by other methods as follows.

Figure 6:
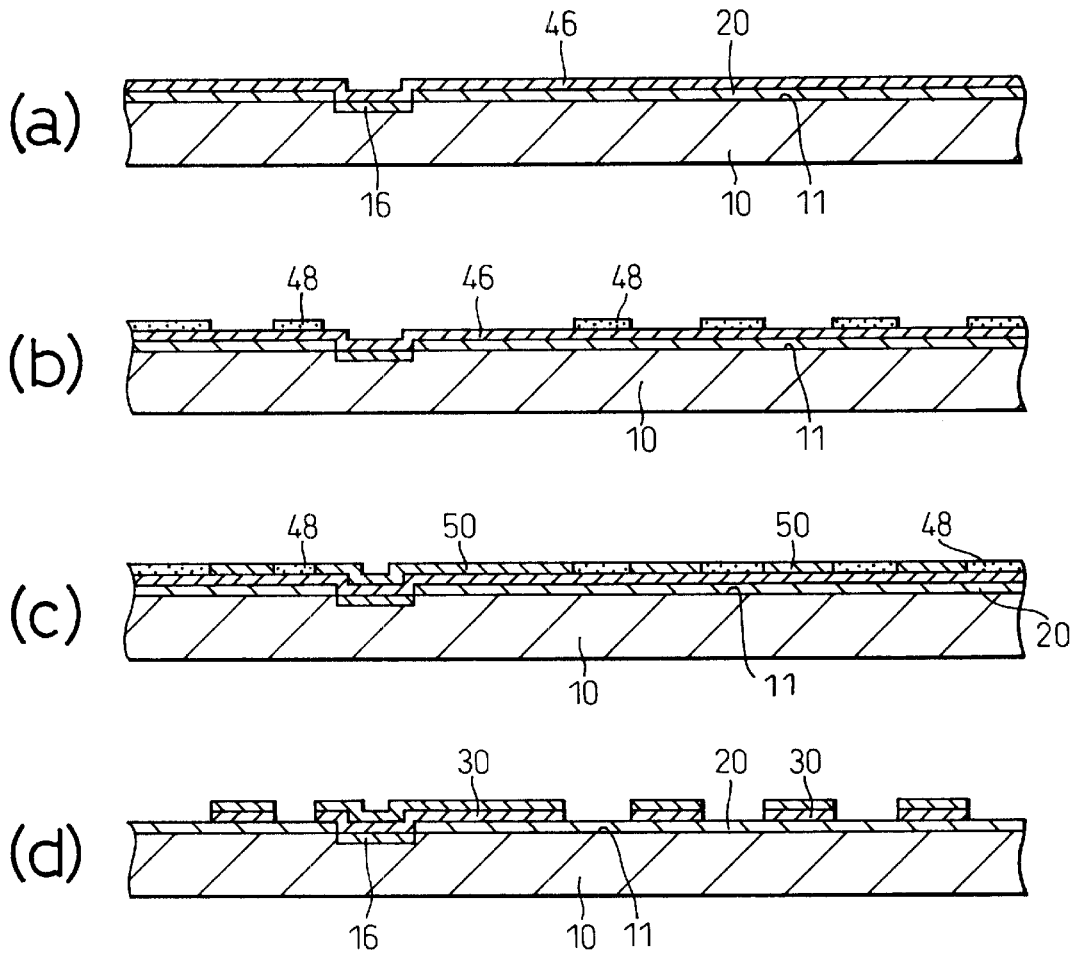
FIG. 6 includes cross-sectional views showing process steps for producing a semiconductor device according to another preferred embodiment of the present invention.
Figure 7:
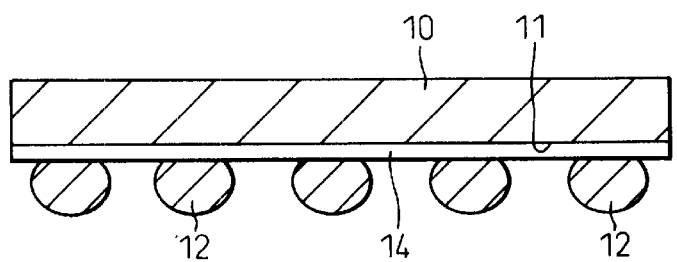
FIG. 7 is a cross-sectional view showing a conventional semiconductor device structure including a semiconductor chip having an electrode terminal carrying surface on which external connection terminals are arranged.
Figure 8:
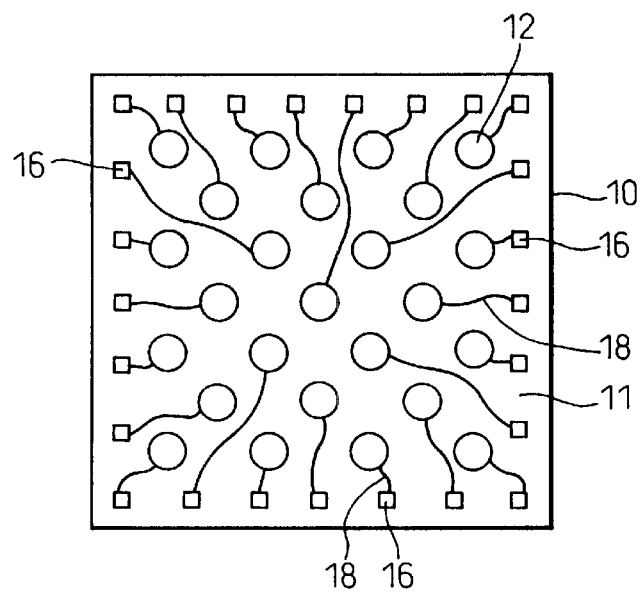
FIG. 8 is a plan view showing a typical arrangement of external connection terminals and electrode terminals of a conventional semiconductor device.

The interconnection wiring line 30 may be formed by a so-called semi-additive process as shown in FIG. 6.

Referring to FIG. 6(a), after the process step shown in FIG. 4(b), sputtering or electroless copper plating is carried out to form a current supply layer or thin conductor layer 46 on the insulating layer 20 including the opening having a side wall and a bottom defined by the exposed surface of the electrode terminal 16.

Referring to FIG. 6(b), a photosensitive resist is then applied to the surface of the thin conductor layer 46, followed by exposure to light and development to form a resist pattern 48 having a reversed pattern of the interconnection wiring 30.

Referring to FIG. 6(c), electrolytic copper plating is carried out to form a conductor layer 50 on the thin conductor layer 46 in the portions exposed through the resist pattern 48.

Referring to FIG. 6(d), the resist pattern 48 is removed by solution thereof to leave the conductor layer 50 in a patterned form and the underlying thin conductor layer 46 in a continuous form. Chemical etching is then carried out to only remove the thin conductor layer 46 in the portions exposed through the patterned conductor layer 50, thereby completing an interconnection wiring line 30 lying on the insulating layer 20 and being composed of an upper substantial portion of the conductor layer 50 and a lower portion of the thin conductor layer 46.

The thin conductor layer 46 is only necessary to provide a current supply layer for the subsequent electrolytic plating of the conductor layer 50 and can be extremely thin to be easily removed by etching while causing no substantial etching of the conductor layer 50 in the absence of a resist or other protection.

The land 32 on the insulating layer 34 shown in FIG. 5(c) may be formed by the above-described process. After the step of FIG. 6(d), an insulating layer 34 is formed to cover the interconnection wiring 30, a thin conductor layer for electrolytic plating is formed on the insulating layer 34, a resist pattern having a reversed pattern of the land 32 is formed on the thin conductor layer, electrolytic copper plating is carried out to form the land 32 on the thin conductor layer in the portion exposed through the resist pattern, the resist pattern is then removed by solution thereof, and the thus-exposed portion of the thin conductor layer is removed to leave the land 32 on the insulating layer 34.

Although the processes shown in FIGS. 4 to 6 produce a semiconductor device on a single piece of the semiconductor chip 10 cut from a semiconductor wafer having plural semiconductor chip parts formed thereon, a plurality of semiconductor devices may be otherwise collectively produced on the same wafer by the same process as described referring to FIGS. 4 to 6 and the wafer is then cut to plural semiconductor devices each including a single piece of the semiconductor chip 10.

As herein described, the present invention provides a semiconductor device having interconnection wiring lines 30 on a layer separate from a layer of the external connection terminals 12, so that the interconnection wiring lines 30 can be arranged more freely with respect to the arrangement of the external connection terminals 12 and the number or density of the external connection terminals 12 can be further increased to facilitate production of multipin CSPs without using multilayer interconnection wiring required in the conventional CSP structure.

What is claimed is:

1. A semiconductor device including a semiconductor chip having electrode terminals electrically connected to external connection terminals, the device comprising:

a semiconductor chip having an electrode terminal carrying surface including electrode terminals and interconnection wiring lines, each of the interconnection wiring lines having one end bonded to one of the electrode terminals and the other end forming a pad;

an insulating layer formed on the electrode terminal carrying surface to cover the electrode terminals, the interconnection wiring lines and the remaining area of the electrode terminal carrying surface;

conductor lands formed on the insulating layer, each of the conductor lands having a part forming a via extending through the insulating layer to the pad of one of the interconnection wiring lines; and external connection terminals formed on the lands;

wherein each of the lands overlaps the interconnection wiring lines with the insulating layer intervening between the lands and the interconnection wiring lines.

2. A semiconductor device according to claim 1, wherein the lands are smaller in diameter than the pad.

3. A semiconductor device according to claim 1, wherein the via is formed of a conductor layer coating a side wall and a bottom of a through hole penetrating the insulating layer, the bottom being defined by a surface of the interconnection wiring lines.

* * * * *

UNITED STATES PATENT AND TRADEMARK OFFICE
CERTIFICATE OF CORRECTION

PATENT NO. : 6,465,886 B1
DATED : October 15, 2002
INVENTOR(S) : Horiuchi et al.

It is certified that error appears in the above-identified patent and that said Letters Patent is hereby corrected as shown below:

Column 8,
Line 12, delete "lands", replace it with -- pads --; and
Line 12, delete "pad", replace it with -- lands --.

Signed and Sealed this

Twenty-fifth Day of February, 2003

JAMES E. ROGAN
*Director of the United States Patent and Trademark Office*